United States Patent
Watanabe et al.

(10) Patent No.: US 7,023,757 B2
(45) Date of Patent: Apr. 4, 2006

(54) SEMICONDUCTOR DEVICE

(75) Inventors: Takao Watanabe, Fuchu (JP); Kunio Uchiyama, Kodaira (JP); Osamu Nishii, Inagi (JP); Naohiko Irie, Kokubunji (JP); Hiroyuki Mizuno, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 192 days.

(21) Appl. No.: 10/373,042

(22) Filed: Feb. 26, 2003

(65) Prior Publication Data

US 2003/0231526 A1 Dec. 18, 2003

(30) Foreign Application Priority Data

Jun. 17, 2002 (JP) .......... 2002-175170

(51) Int. Cl.
*G11C 8/00* (2006.01)
*G06F 1/26* (2006.01)

(52) U.S. Cl. .......... 365/227; 365/226; 713/323; 713/324

(58) Field of Classification Search .......... 365/226, 365/227; 713/323, 324
See application file for complete search history.

(56) References Cited

U.S. PATENT DOCUMENTS 5,396,635 A * 3/1995 Fung .......... 713/323
5,532,524 A * 7/1996 Townsley et al. .......... 307/64
5,925,132 A * 7/1999 Kadokura .......... 713/323
5,970,018 A 10/1999 Iwata et al. .......... 365/230.06
6,055,206 A * 4/2000 Tanizaki et al. .......... 365/230.06
6,212,641 B1 * 4/2001 Frank et al. .......... 713/323
6,657,911 B1 * 12/2003 Yamaoka et al. .......... 365/226

FOREIGN PATENT DOCUMENTS

JP 10-208473 8/1998

OTHER PUBLICATIONS

H. Kawaguchi et al, "A CMOS Scheme for 0.5V Supply Voltage with Pico–Ampere Standby Current", ISSCC98, Session 12, 1998, pp. 192–193.

* cited by examiner

*Primary Examiner*—Son Mai
(74) *Attorney, Agent, or Firm*—Mattingly, Stanger, Malur & Brundidge, P.C.

(57) ABSTRACT

When a leakage current of a circuit block under a non-use state is reduced by means of a power switch, frequent ON/OFF operations of the switch within a short time invite an increase of consumed power, on the contrary. Because a pre-heating time is necessary from turn-on of the switch till the circuit block becomes usable, control of the switch during an operation deteriorates a processing time of a semiconductor device. The switch is ON/OFF-controlled with a task duration time of a CPU core for controlling logic circuits and memory cores as a unit. After the switch is turned off, the switch is again turned on before termination of the task in consideration of the pre-heating time.

11 Claims, 6 Drawing Sheets

| task φST | A | B | C | D | E | F |
|---|---|---|---|---|---|---|
| φST-1 | H | H | H | L | L | H |
| φST-2 | L | L | H | H | H | H |
| ⋮ | ⋮ | ⋮ | ⋮ | ⋮ | ⋮ | ⋮ |
| φST-n | L | L | L | H | L | H |

SEMICONDUCTOR DEVICE

BACKGROUND OF THE INVENTION

This invention relates to a semiconductor device including a semiconductor integrated circuit that is fabricated by integrating a CPU core, a logic core, a memory core, and so forth.

An operation speed and power consumption of a semiconductor integrated circuit have been improved owing to scaling of MOS transistors. In the latest semiconductor integrated circuits using MOS transistors having a processing size of about 0.15 µm or below, however, it has become more difficult to simultaneously satisfy the speed and power performance due to scaling of a power source voltage. For, a sub-threshold leakage current increases because a threshold voltage of the MOS transistor is set to a lower level to secure a speed at a low power source voltage.

Most of existing semiconductor integrated circuits use a CMOS circuit ideally because an AC current with charge/discharge of a load capacitance flows through the CMOS circuit only during its operation but does not flow during standby. However, the sub-threshold leakage current always flows as a DC current. The sub-threshold leakage current becomes greater as the threshold voltage of the MOS transistor becomes lower. Therefore, in the CMOS circuit using the MOS transistor having a low threshold voltage, deterioration of power performance due to the sub-threshold leakage current reaches a level that can never be neglected.

As a known technology for reducing this sub-threshold leakage current, a system (first known technology) has been proposed that interposes a power switch using an MOS transistor having a high threshold voltage between a circuit and a power source line and keeps this MOS transistor OFF during standby, in the Preliminary Report of International Solid State Circuits Conference [ISSCC], p. 192–193, San Francisco, US, February, 1998. A system described in JP-A-10-208473 (second known technology) corresponding to the U.S. Pat. No. 5,970,018 is another example of this type.

SUMMARY OF THE INVENTION

According to the first known technology, the power switch cuts off the sub-threshold leakage current (hereinafter called "leakage current") during standby of the semiconductor device.

As miniaturization of MOS transistors further proceeds and the power source voltage becomes as low as 1 V or below, for example, the threshold voltage must be set to a lower voltage with the result that the leakage current further increases. On the other hand, the AC current during the operation decreases in proportion to the power source voltage. In consequence, a proportion of the leakage current to the consumed current in the operation is expected to increase, and the leakage current cannot be neglected in comparison the AC current in the operation.

The second known technology teaches to turn off the power switch for a circuit block under a non-use state during the operation, too. However, the following two problems arise when cut-off of the current by the power switch during the operation is accomplished.

The first problem is the one that the consumed current increases, on the contrary, when the power switch is frequently turned on and off. Because the entire integrated circuit does not always operate during the operation, it is possible to cut off currents to the circuit blocks under the non-use state by operating the power switch. However, when ON/OFF of the power switch is repeated within a short time, a transient current consumed for turning on the power switch may become greater than the reduction of the leakage current brought forth by cut-off of the power switch, on the contrary.

The second problem is the problem that the speed of the integrated circuit drops due to ON/OFF of the power switch. A certain period of time (hereinafter called "pre-heating time") is necessary from ON timing of the power switch to the timing when the circuit whose current is cut off can be again utilized. Therefore, the speed of the integrated circuit greatly drops in some cases.

The invention employs the following means to solve the problems described above. To solve the first problem, the means of the invention controls the power switch by utilizing a duration time of a task of a processor (CPU) for controlling the integrated circuit. More concretely, this means looks up a task ID register and a resource management register inside the CPU and turns off a power switch for supplying currents to circuit blocks under a non-use state. Generally, a current reduction effect brought forth by cutting off the leakage current becomes effective in comparison with current consumption due to ON/OFF of the current switch when the power switch can be turned off for a time longer than several microseconds, though depending on a circuit scale. In contrast, since the duration time of a task is generally about 1 millisecond, the problem described above can be solved when the power switch is managed in the duration time of the task. To solve the second problem, the means of the invention turns on the power switch after it is turned off and a certain time lapses away but before the next task begins. When this predetermined time is set to a time shorter than the balance of time acquired by subtracting the pre-heating time (time necessary for charging an artificial power source line) from the task duration time, the pre-heating time finishes before the next task beings, and the delay of the next task can be avoided.

Other objects, features and advantages of the invention will become apparent from the following description of the embodiments of the invention taken in conjunction with the accompanying drawings.

DESCRIPTION OF THE EMBODIMENTS

Preferred embodiments of the invention will be hereinafter explained with reference to the accompanying drawings.

Figure 1:
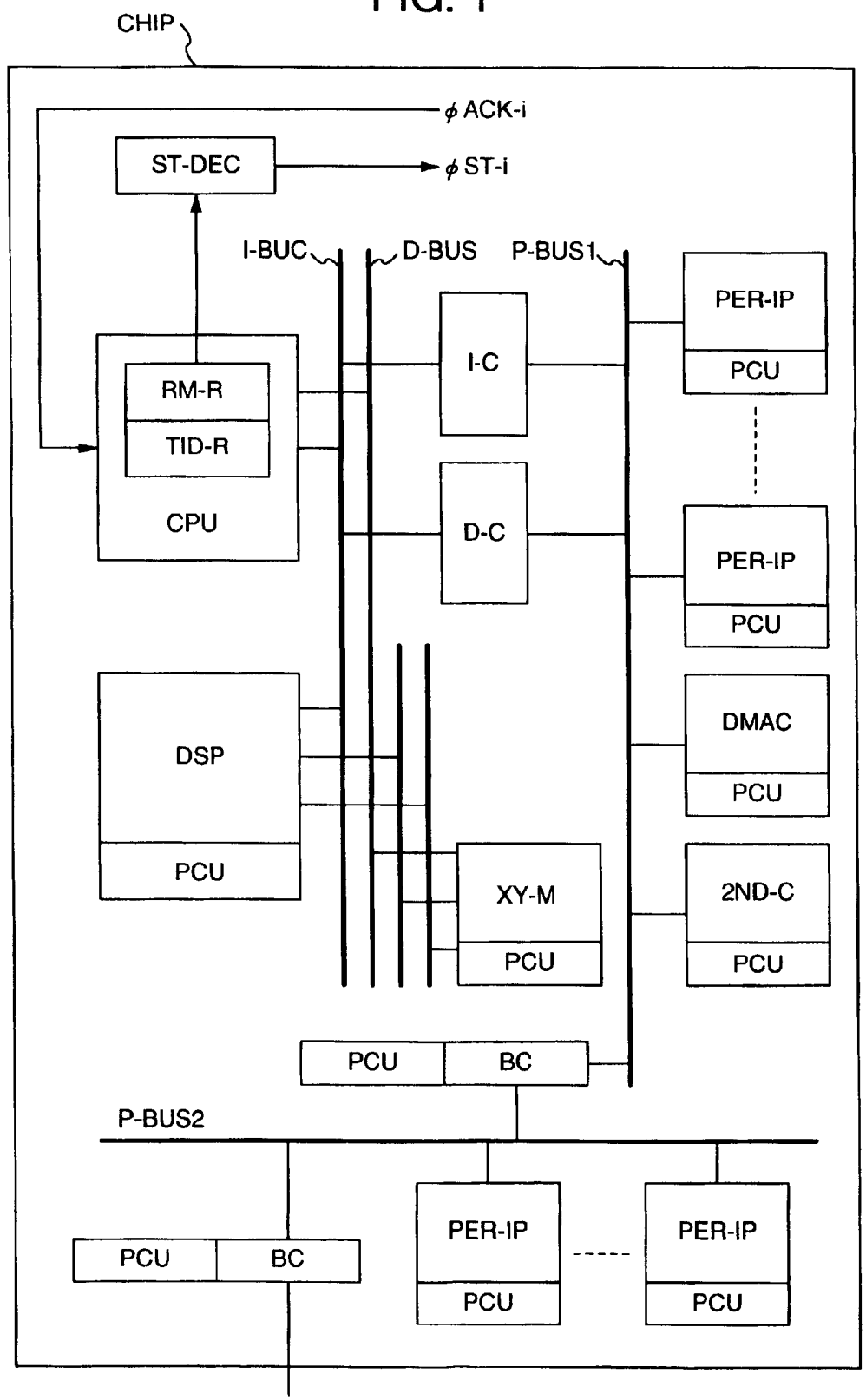
FIG. 1 is a block diagram of a semiconductor device according to the invention.

FIG. 1 shows a basic construction when the invention is applied to a semiconductor integrated circuit fabricated by integrating a CPU core, a DSP core, various logic cores and memory cores, and so forth, on one chip. However, the invention is not limited to the semiconductor integrated circuit of the one-chip form shown in FIG. 1 but can also be applied to semiconductor devices of a so-called "multi-chip package" type in which a plurality of chips is integrated to one package, and to their combinations. Explanation will be hereinafter given on the one-chip form shown in FIG. 1 for ease of explanation.

Referring to FIG. 1, a silicon chip CHIP includes, as main cores, a CPU core CPU, a DSP core DSP, an instruction cache I-C, a data cache D-C, an XY memory XY-M, a secondary cache 2 ND-C, a direct memory access control circuit DMAC, a peripheral IP core PER-IP and a bus control circuit BC. A task ID register TID-R is a register inside the CPU core and manages each task. A resource management register RM-R is a register that manages the resources (cores) used. A power control unit PCU is disposed for each resource (core) as a power control unit. A state decoder ST-DEC sends to the power control unit PCU a state signal φST representing whether or not to use each resource (core).

Further, I-BUS, D-BUS, P-BUS1 and P-BUS2 respectively represent an instruction bus, a data bus, a first peripheral bus and a second peripheral bus.

Among the constituent units shown in FIG. 1, various cores such as the CPU core, memories and buses represent examples of the basic units that constitute a chip for digital processing. (These circuit blocks and basic units such as the memories will be hereinafter called "components"). Since these components are assumed to respectively have ordinary operations, explanation of their functions will be hereby omitted. In the invention, a power switch for each component that is not used is cut off during the operation of the semiconductor device to reduce a leakage current. Initially, the state decoder ST-DEC transfers to each component a state signal φST representing whether or not to use the component on the basis of the contents of the task ID register ID-R inside the CPU core and the resource management register RM-R managing resources (components) used. The power control unit PCU in each component detects from the state signal φST whether or not the component is used. When the component is not used, the power switch disposed inside the power control unit PCU cuts off the power source.

Incidentally, in the construction shown in FIG. 1, the power control unit PCU is not provided to each of the CPU core, the data cache D-C as its primary cache and the instruction cache I-C. For, a time margin capable of cutting their power sources is too short during the operation. It is also possible not to add the power control unit PCU to other components that do not have a sufficient time margin for cutting off the power source.

Figures 2, 3:
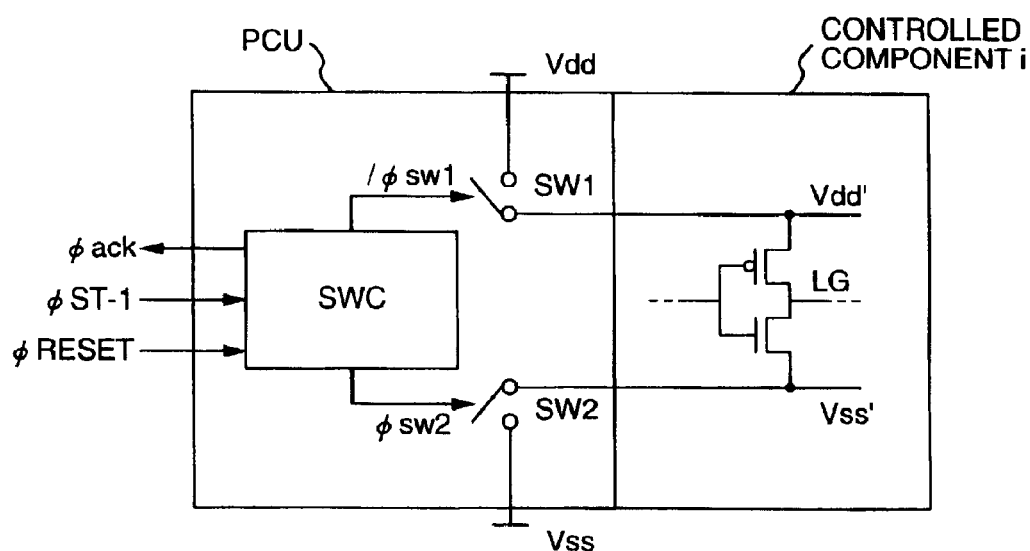
FIG. 2 shows an example of transition of a state signal for each component.
FIG. 3 shows input/output signals to a power control unit.

The power control operation in the invention will be explained with reference to FIG. 2 to FIG. 6. FIG. 2 shows an example of the state signal φST outputted from the state decoder ST-DEC. In this embodiment, sign n represents the number of components as the control object of the leakage current. The state signals φST-1 to φST-n represent whether or not these components are used. Signs A to F in the first row represent the tasks of the CPU, and the components used are different depending on the task. When the state signal φST-i is "H" (high level) in the embodiment, it means that the corresponding component is used. When the state signal φST-i is "L" (low level), it means that the corresponding component is not used. The component 1, for example, is used for the tasks A to C and F but is not used for the tasks D and E. Therefore, it is possible for the component 1 to cut off the power switch and to reduce the leakage current in the tasks D and E.

As described above, the state signal φST is transferred to the power control unit PCU in each component and the power control unit controls the power switch. FIG. 3 shows a concrete structural example of the power control unit PCU. The power switch SW1 is interposed between a power source Vdd on a high potential side and a circuit LG constituting the controlled component i. The power switch SW2 is interposed between a power source Vss on a low potential side and a circuit LG constituting the controlled component i. (Though the drawing shows only one inverter to simplify the explanation, the circuit LG is of course a circuit necessary for exploiting the function of the controlled component). The drawing shows a CMOS inverter circuit as the circuit LG by way of example. A power switch control circuit SWC controls the power switches SW1 and SW2. Symbols φack and φRESET are signals that respectively represent the end of a pre-heating time after the power switches SW1 and SW2 are turned on, and a reset signal for resetting halfway the power switch control. When the state signal φST-i changes to "L", the power switch control circuit SWC turns off the power switches SW1 and SW2. In consequence, the leakage current between the power source and the component i is cut off.

Incidentally, the power switch SW is provided to both of the power source Vdd on the high potential side and the power source Vss on the low potential side in the example shown in FIG. 3. However, the power switch may be provided to only one of them when no leakage path of the current exists inside the circuit constituting the component. In such a case, an occupying area becomes small and power for turning on/off the power switch can be reduced, too.

Figure 4:
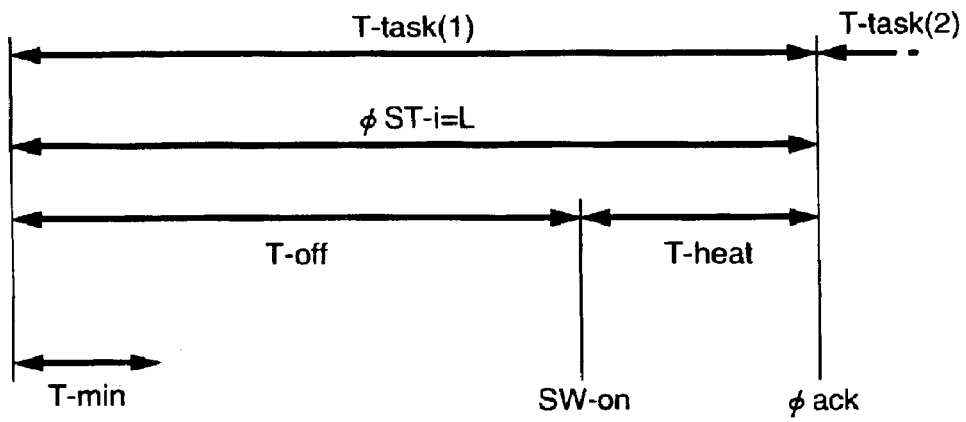
FIG. 4 shows timing of switch control during a task.

The basic operation of the power control unit PCU shown in FIG. 3 will be explained with reference to FIG. 4. FIG. 4 shows the operation of the power control unit PCU of the component i when the state signal φST-i changes to the "L" level, that is, the operation during the task duration period T-task.

First, when the state signal φST-i reaches the "L" level, the power control unit PCU cuts off the power switch of the component i. When the time T-off (that means the switch-off period) thereafter lapses away, the power control unit PCU turns on the switch (SW-on) and connects the component i to the power source. Here, the time T-off is so set as not to exceed the balance obtained by subtracting the pre-heating time T-heat of the component i from the duration time T-task of the task. The pre-heating time T-heat is a time required for charging artificial power source lines Vdd' and Vss of the circuit LG. Consequently, pre-heating has been finished at the point of time when this task is completed, and the occurrence of a waiting time when the component i is used for the next task can be avoided. The pre-heating time varies with the construction of the component and with the circuit scale. Therefore, the T-off time is preferably set for each component. In this case, it is possible to employ a circuit construction in which a ring oscillator circuit and a counter for adding output pulses are assembled into the power control unit PCU and are allowed to operate simultaneously with cut-off of the power switch and the power switch is turned on when the value of the counter exceeds a value set in advance for each component.

On the other hand, when the power switch is turned on and off within a short time as described above, a current required for driving the power switch may become greater than the effect of reducing the leakage current by turning off the power switch. Assuming that a minimum effective period of switch-off, that is defined as the switch-off period in which consumed power reduced by the reduction of the leakage current is equal to consumed power required for driving the power switch, is T-min, T-off must be greater than T-min. Since the switch must be turned on beforehand by the time corresponding to the pre-heating time as described above, too, T-off must after all satisfy the following relation:

$$T\text{-min} \leq T\text{-off} \leq T\text{-task} - T\text{-heat} \quad (1)$$

The value of the minimum effective time T-min varies with the leakage current and with the size of the switch but is ordinarily dozens of microseconds. The pre-heating time T-heat, too, is dozens of microseconds. On the other hand, the task duration time is generally in the order of milliseconds. Therefore, when switch control is conducted on the basis of the task as in the invention, the relation (1) can be easily satisfied. The minimum effective time T-min and the pre-heating time T-heat can be in advance estimated by conducting simulation through circuit analysis and by conducting calculation on the basis of circuit constants. Therefore, circuits and memories may well be so designed as to satisfy the relation (1) when deciding to which extent these members are defined as the "components" at the time of designing of the semiconductor device. In the example shown in FIG. 1, the component is defined for each function, but cores having mutually different functions (a plurality of peripheral IP cores, for example) may be collectively defined as one component and may be controlled by a common switch. A circuit block not capable of satisfying the condition (1) is preferably kept always connected to the power source without adding the power control unit PCU.

In the example shown in FIG. 4, the power switch is automatically turned on when the predetermined time (T-off) lapses away after the power switch is turned on. This method can conceal the delay due to the pre-heating time T-heat but when this component is not used in the next task, the power switch is again turned off. Consequently, the consumed current for turning on the power switch goes to waste. When the waste is the problem, control may be conducted in such a fashion that the use/non-use of the component is judged beforehand with reference to the task ID register TID-R of the CPU and the power switch is not turned on when the component is not used.

In contrast, when an interrupt occurs, the task is given up halfway, and control to cope with this operation must be conducted. It will be assumed that an interrupt occurs when the state signal φST-i represents the non-use state for a certain component and the present task is terminated. No problem occurs if the component remains under the non-use state in the next task, too. In this case, cut-off of the power switch is kept as such and the power switch is turned on at the point corresponding to the balance obtained by subtracting the pre-heating time T-heat from the task termination time. However, when the interrupt occurs and the component is to be used in the next task, control shown in FIG. 5 becomes necessary.

First, the φRESET signal is activated to "H" with the interrupt so as to reset the sequence of power switch control and to turn on the power switch (SW-on). Next, an acknowledgment signal φack representing the termination of pre-heating is activated to "H" at completion of pre-heating, and the next task task(2) is started. When the interrupt occurs, the delay corresponding to the pre-heating time T-heat occurs in this way. In practice, a plurality of components exists and the pre-heating time required for each component is different. Therefore, the CPU may well start the next task after the acknowledge signal φack from all the components to be used after the interrupt are activated.

Figure 6:
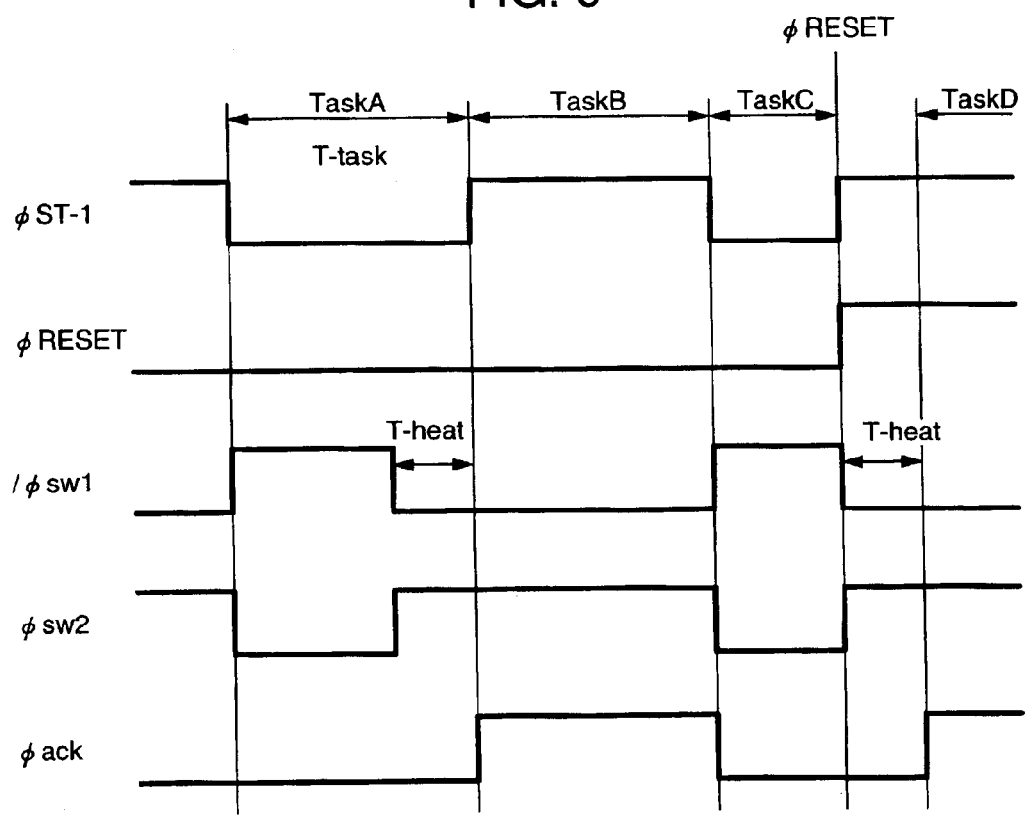
FIG. 6 shows timing of signals for switch control.

FIG. 6 is a time chart showing transition of each signal of a component i in continuous tasks A, B, C and D. In this time chart, signals φSW1 and φSW2 for controlling the power switch have opposite polarities. The power switch is ON at "L" of the signal φSW1 and OFF at "H". The power switch is OFF at "L" of φSW2 and ON at "H". To represent this power switch operation, φSW1 is expressed as "/φSW1".

Figure 5:
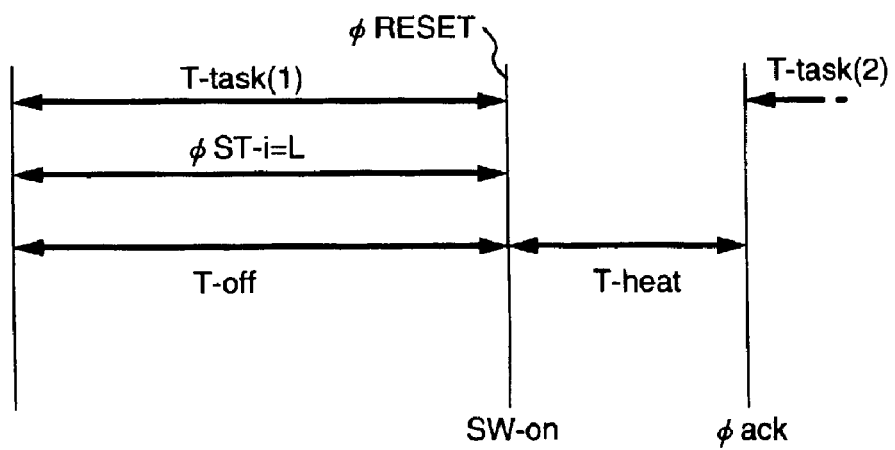
FIG. 5 shows timing of switch control when an interrupt processing occurs.

In FIG. 6, the state signal φST-i is "L", "H", "L" and "H" in the tasks A, B, C and D, respectively. In other words, the component i changes its state to "non-use", "use", "non-use" and "use", respectively, in this embodiment. First, control shown in FIG. 4 is conducted in the task A. To turn off the power switch, /φSW1 and φSW2 are changed to "H" and "L", respectively, and the leakage current is cut off. The potentials of the signals /φSW1 and φSW2 are returned to the original potentials at the point earlier by the pre-heating time T-heat than the termination time of the task A and the power switch is turned on. In the next task B, the state signal φST-i changes to "H" and the component i is under the use state. Since pre-heating has been completed in the preceding task A, the task B can be started at this time without the occurrence of the delay time. In the next task C, the state signal φST-i again changes to "L" and the component i is under the non-use state. In this example, the interrupt occurs under this state and the task C changes to the task D within a shorter time than the ordinary task duration time. Control shown in FIG. 5 is conducted in this case. Next, φRESET is inputted, the potentials of /φSW1 and φSW2 are changed to "L" and "H", respectively, and the power switch is turned on. When the pre-heating time T-heat thereafter lapses away, the acknowledgement signal φack changes to "H". When all the acknowledgement signals φack of other components the state of which changes from the non-use state to the use state are switched, the CPU executes the task D as the next task. As described above, power control according to the invention can cut off the leakage current of the non-use components during the normal operation without inviting the delay time. When the interrupt occurs, too, an erroneous operation does not occur because the task shifts to a next task after termination of pre-heating is confirmed.

Figure 7:
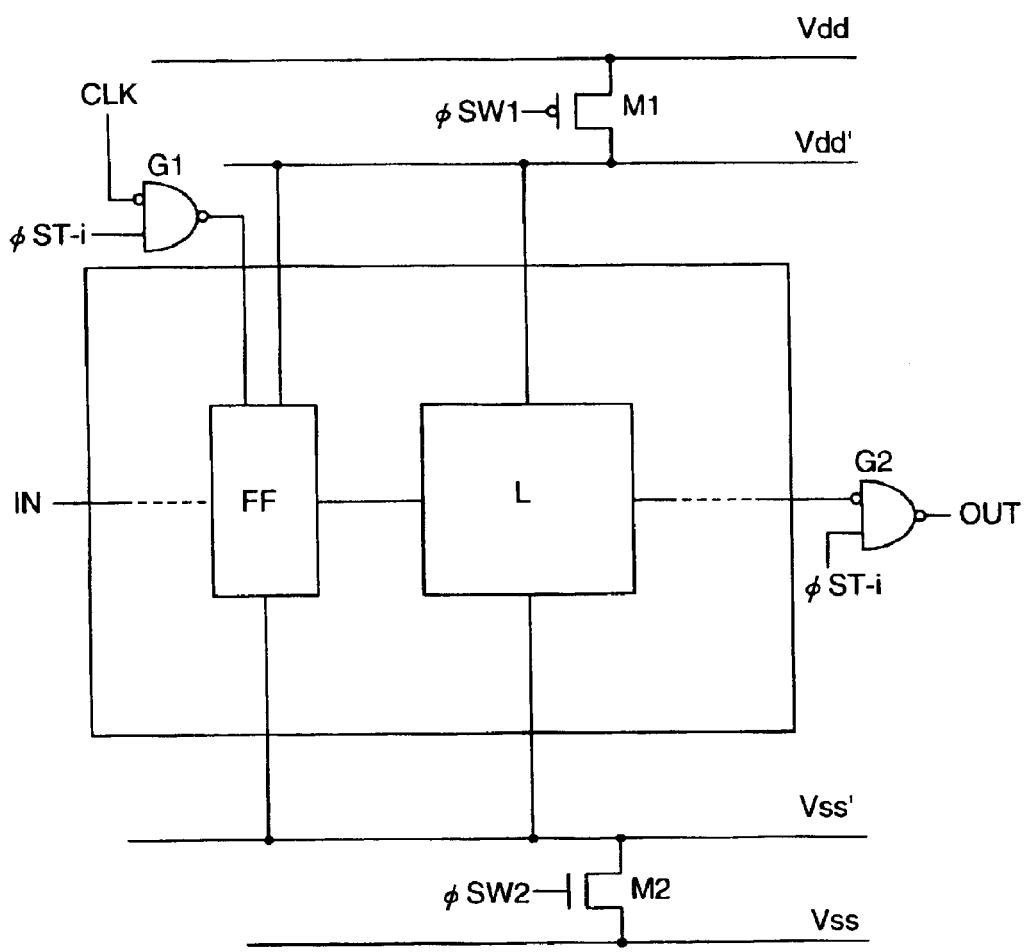
FIG. 7 shows a construction of a logic block inside a semiconductor device according to the invention.
Figure 8:
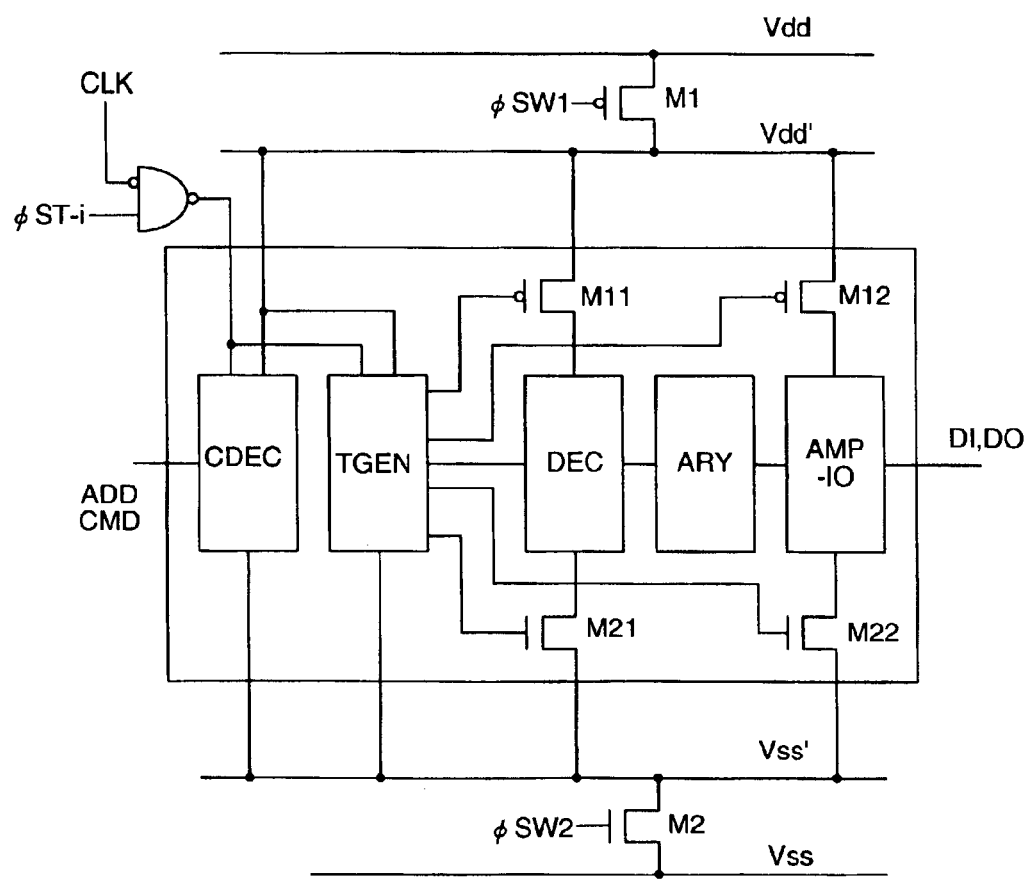
FIG. 8 shows a construction of a memory block inside the semiconductor device according to the invention.

The method of cutting off the leakage current in accordance with the use state of the components has so far been described. However, greater power can be reduced in some cases depending on the components by combining this method with other methods. FIGS. 7 and 8 show examples of such methods. FIG. 7 shows an example that uses cut-off of the leakage current described above in combination with cut-off of a clock signal in a component such as a circuit block operating in synchronism with the clock. A synchronous type circuit block generally includes a flip-flop circuit FF for latching input data and a logic circuit L as its units. Symbols M1 and M2 respectively denote a P-channel MOS transistor and an N-channel MOS transistor, and they operate as power switches. Since these MOS transistors operate as the power switches, absolute values of their threshold voltages are preferably set to greater values than the absolute values of the threshold voltages of MOS transistors used in the logic circuit L. Alternatively, the amplitudes of /φSW1 and φSW2 are regulated so that a gate-to-source voltage becomes a negative potential at the time of OFF and the leakage current becomes sufficiently small when the power switch is OFF. Incidentally, the embodiment shown in FIGS. 7 and 8 uses the MOS transistors because of the advantage that these transistors can be fabricated through the same process as that of other circuits. To completely cut off the leakage current, however, the switch may be formed of other means such as a mechanical switch disposed outside the semiconductor chip, for example.

A gate G1 is a circuit for controlling whether the clock signal CLK is inputted or cut off and a gate G2 is a circuit for preventing the output signal of the logic circuit from entering a floating state when the power switch is turned off. These circuits G1 and G2 may be provided to the power control unit PCU. The basic operation is explained below.

First, when the state signal φST-i changes to the "L" level, the gate G1 cuts off the input of the clock signal CLK to the flip-flop FF. The switch control signals /φSW1 and φSW2 change to the "H" level and the "L" level, respectively as described above and the power switch is cut off. Since both of the clock input and the leakage current are cut off in this way, the effect of reducing consumed power is great. Though the drawings show only one flip-flop FF to which the clock is inputted, a large number of flip-flops exist in practice. Therefore, the power reduction effect is great by cutting off the clock input. When the state signal φST-i changes to the "L" level due to the gate G2, the output OUT of the logic circuit is fixed. It is thus possible to prevent the leakage current (so-called "penetration current") created when the input of the next stage enters the floating state. Next, when the time corresponding to the balance obtained by subtracting the pre-heating time from the task duration time lapses away, the power switches M1 and M2 are turned on. When the tasks are terminated, the state signal φST-i changes to the "H" level, cut-off of the clock signal CLK and fixing of the output signal are terminated, and the operation of this component starts. Here, control is conducted by inputting the state signal φST-i to the gate G1 because a long pre-heating time as required for a power switch is not necessary for inputting the clock signal. As explained above, this embodiment utilizes the task duration time, simultaneously controls the power switch and the clock input and provides the great power reduction effect.

FIG. 8 shows an example of the application of the invention to a memory such as a secondary cache. In FIG. 8, symbols CDEC, TGEN, DEC, ARY and AMP-IO respectively represent a command decoder, a timing generator, a decoder, a memory array, and a sense amplifier-input/output circuit. Symbols ADD, CMD, DI and DO respectively represent an address, a command, input data and output data. These symbols are handled as the signals themselves in some cases and as their input lines or output lines in other cases for the sake of explanation. The drawing depicts a plurality of signal lines as one line to simplify illustration. Symbols M1, M2, M11, M12, M21 and M22 represent power switches each comprising an MOS transistor. Among them, M1 and M2 are the power switches for cutting off all the components from the power source, M11 and M21 are power switches for cutting off the decoder DEC from the power source and M12 and M22 are power switches for cutting off the sense amplifier and the input/output circuit AMP-IO from the power source.

In FIG. 8, the power switch for cutting off the component from the power source and the power switch for selectively cutting off the circuit elements of the component from the power source are provided. Therefore, the leakage currents of the entire components can be cut off when the components are under the non-use state and moreover, when the components are under the use state, too, the element circuit or circuits can be selectively cut off from the power source. Consequently, the reduction effect of the leakage current can be made greater. More concretely, the MOS transistors M1 and M2 are turned off when the state signal φST-i is at the "L" level. When the state signal φST-i is at the "H" level, the MOS transistors M1 and M2 are ON whereas the MOS transistors M11 and M21 or the MOS transistor M12 and M22 are turned off when the decoder DEC and the sense amplifier-input/output circuit AMP-IO need not be activated. In memories in general, the time from input and subsequent read or write of an address or command to input of a next address or command is called a "cycle time". The decoder DEC and the sense amplifier-input/output circuit AMP-IO do not always operate during this cycle time but operate for only a predetermined time that is managed by the timing generator TGEN. Therefore, the power switch can cut off the leakage current during the non-use period under control of this timing generator TGEN.

In the example shown in FIG. 8, the memory array ARY is not discretely equipped with the switch. For, since the secondary cache is constituted with volatile memory cells such as SRAM, data will be lost if the power source is cut off. In this case, too, the current can be reduced to such an extent that the data is not lost without completely cutting off the power source. Alternatively, the data can be persevered even when the current is cut off by use of non-volatile memory cells such as ferroelectric memories or magnetic memories for the memory cells. The switches M1 and M2 for cutting off the leakage current of the entire memories cut off the power source inclusive of that of the memory array but this operation is limited to the case where the data of the memory may well be lost with the change of the tasks. When the data must be preserved with the change of the tasks, a construction in which the memory array ARY is kept always connected to the power source may be employed. Further, the element circuits to be discretely equipped with the switch need not be limited to the decoder DEC and the sense amplifier-input/output circuit AMP-IO but may include other element components. Further, various other modifications may be made in the invention, whenever necessary.

The method of reducing the leakage current during the operation of the semiconductor device has so far been described. In this instance, it is also possible to reduce power by cutting off the power switch during standby of the semiconductor device. A delay of a certain level is permitted in most cases when the entire semiconductor device shifts from the standby state to the operation state. Therefore, the switch need not be kept ON beforehand in consideration of the pre-heating time.

The invention can thus reduce effectively the leakage current during the operation state of the integrated circuit.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
   a power source line;
   a plurality of circuit blocks containing at least one first circuit block;
   at least one switch so arranged as to respectively correspond to said at least one first circuit block, for controlling the supply of a power source from said power source line to said first circuit block; and
   a processor for executing a task by keeping at least one of said plurality of circuit blocks under a use state;
   wherein said first circuit block receives a state signal instructing a shift thereof to a non-use state and turns off said switch corresponding thereto and, in case of execution of said task by said processor, said switch is turned on before said first circuit block receives a state signal instructing a shift thereof to a use state.

2. A semiconductor device according to claim 1, wherein said plurality of circuit blocks includes at least one second circuit block connected to said power source line without passing through a switch.

3. A semiconductor device according to claim 1, wherein a period of time T-off in which said first circuit block turns off said switch satisfies a relation:

$$\text{T-off} < (\text{task duration time T-task}) - (\text{pre-heating time T-heat}),$$

and said pre-heating time T-heat is decided in accordance with at least a circuit scale of said first circuit block.

4. A semiconductor device according to claim 1, wherein a period of time T-off in which said first circuit block turns off said switch satisfies a relation:

$$\text{time T-min} < \text{T-off},$$

and said time T-min is decided in accordance with consumed power by a sub-threshold current of said first circuit block and with consumed power for driving a power source switch.

5. A semiconductor device according to claim 1, wherein said first circuit block includes a flip-flop for inputting and outputting data in response to input of a clock signal, a logic circuit for receiving an output of said flip-flop and a first gate circuit, wherein said first gate circuit receives a state signal instructing a shift of said first circuit block to a non-use state and cuts off input of said clock signal to said flip-flop in execution of a task by said processor.

6. A semiconductor device according to claim 5, which further includes a second gate circuit, wherein said second gate circuit receives a state signal instructing a shift of said first circuit block to a non-use state and controls an output of said logic circuit to a predetermined level during execution of a task by said processor.

7. A semiconductor device according to claim 1, wherein said first circuit block includes a plurality of element circuits, wherein at least one of said plurality of element circuits can discretely control the supply of power.

8. A semiconductor device comprising:

a power source line;

a plurality of circuit blocks containing at least one first circuit block;

at least one switch so arranged as to respectively correspond to said at least one first circuit block, for controlling the supply of a power source from said power source line to said first circuit block; and a processor for executing a task by keeping at least one of said plurality of circuit blocks under a use state;

wherein said first circuit block controls said switch in accordance with a state signal instructing a shift of said first circuit block to a non-use state or a use state in accordance with execution of a task by said processor.

9. A semiconductor device comprising:

a power source line;

a plurality of circuit blocks containing at least one first circuit block;

at least one switch so arranged as to respectively correspond to said at least one first circuit block, for controlling the supply of a power source from said power source line to said first circuit block; and a processor for executing a task by keeping at least one of said plurality of circuit blocks under a use state;

wherein said switch is controlled in accordance with a duration of execution time of said task as a unit.

10. A semiconductor device according to claim 8, wherein when said switch is controlled during execution of said task, the first circuit block shifts from a non-use state to a use state.

11. A semiconductor device according to claim 9, wherein when said switch is controlled during execution of a task by said processor, the first circuit block shifts from a non-use state to a use state.

* * * * *